US010942255B2

(12) United States Patent
Balasubramaniyan et al.

(10) Patent No.: US 10,942,255 B2
(45) Date of Patent: Mar. 9, 2021

(54) APPARATUS AND METHOD FOR INTEGRATING SELF-TEST OSCILLATOR WITH INJECTION LOCKED BUFFER

(71) Applicant: GLOBALFOUNDRIES U.S. Inc., Santa Clara, CA (US)

(72) Inventors: Arul Balasubramaniyan, Plano, TX (US); Abdellatif Bellaouar, Richardson, TX (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 146 days.

(21) Appl. No.: 16/157,230

(22) Filed: Oct. 11, 2018

(65) Prior Publication Data
US 2020/0116823 A1   Apr. 16, 2020

(51) Int. Cl.
*G01S 7/40* (2006.01)
*H03F 3/45* (2006.01)
(Continued)

(52) U.S. Cl.
CPC .............. *G01S 7/40* (2013.01); *G01S 7/4052* (2013.01); *H01L 27/1203* (2013.01);
(Continued)

(58) Field of Classification Search
CPC ............ H01L 29/78648; H03B 5/1243; H03B 2200/0034
See application file for complete search history.

(56) References Cited

U.S. PATENT DOCUMENTS 6,225,871 B1 * 5/2001 Chien .................. H03B 5/1228
331/117 FE
7,557,664 B1 * 7/2009 Wu ........................ H03B 19/14
327/115
(Continued)

OTHER PUBLICATIONS

S. Kim et al., "A Fully-Integrated Low Power K-band Radar Transceiver in 130 nm CMOS Technology"; Journal of Semiconductor Technology and Science; col. 12, No. 4; Dec. 2012; Seoul, Republic of Korea. (Year: 2012).*
(Continued)

*Primary Examiner* — Bernarr E Gregory
(74) *Attorney, Agent, or Firm* — David Cain; Hoffman Warnick LLC

(57) ABSTRACT

The disclosure provides an apparatus including: a pair of signal injection transistors each having a gate terminal coupled to a differential reference signal, and a pair of cross-coupled amplifier transistors configured to amplify a voltage of the differential reference signal to yield a voltage-amplified reference signal at a local oscillator (LO) port of a mixer; an electronic oscillator having an oscillation output node coupled to the LO port of the mixer in parallel with the injection-locked buffer, and configured to generate an oscillator output for transmission to the output node based on a back gate bias voltage applied to the electronic oscillator; and an access transistor having a gate coupled to a switching node, and a back gate terminal coupled to the back gate bias voltage, wherein the access transistor is configured to enable or disable current flow through the electronic oscillator in parallel with the injection-locked buffer.

20 Claims, 6 Drawing Sheets

(51) Int. Cl.
| | |
|---|---|
| H03B 5/12 | (2006.01) |
| H01L 27/12 | (2006.01) |
| H03F 3/195 | (2006.01) |
| H01L 29/786 | (2006.01) |
| H01L 29/06 | (2006.01) |
| H04B 1/16 | (2006.01) |

(52) U.S. Cl.
CPC ........... *H03B 5/1215* (2013.01); *H03F 3/195* (2013.01); *H03F 3/45183* (2013.01); *G01S 2007/4069* (2013.01); *H03B 2200/0022* (2013.01); *H03B 2200/0074* (2013.01); *H03F 2200/451* (2013.01); *H03F 2200/87* (2013.01); *H03F 2203/45018* (2013.01)

(56) References Cited

U.S. PATENT DOCUMENTS

| | | | | |
|---|---|---|---|---|
| 8,067,987 | B2* | 11/2011 | Sen | H03L 7/099 331/2 |
| 8,487,670 | B2* | 7/2013 | Fagg | H03B 5/1228 327/118 |
| 8,570,109 | B2* | 10/2013 | Song | H03K 3/0322 331/57 |
| 8,860,513 | B1* | 10/2014 | Chong | H03K 3/0322 331/57 |
| 2013/0093475 | A1* | 4/2013 | Chang | H03B 19/14 327/118 |
| 2013/0328633 | A1* | 12/2013 | Zhang | H03B 5/1218 331/34 |

OTHER PUBLICATIONS

J. Song et al., "A 13 GHz 3:2 Transformer Based Linear Transconductance VCO"; proceedings of the 2015 International SoC Design Conference; Gyungju, Republic of Korea; IEEE, Piscataway, New Jersey, USA. (Year: 2015).*

S. Kim et al., "A W-Band Signal Generation Using N-Push Frequency Multipliers for Low Phase Noise"; IEEE Microwave and Wireless Components Letters; vol. 24, No. 10; Oct. 2014; IEEE, Piscataway, New Jersey, USA. (Year: 2014).*

J. Song, A Study on Low-Phase-Noise 77-GHz CMOS Transmitter for FMCW Radar: Ph.D. Dissertation; Graduate School of Electrical and Computer Engineering; Seoul National University; Seoul, Republic of Korea. (Year: 2017).*

J. H. Song et al, "Q-band VCO and Injection-locked Buffer for 77-GHz Automotive Radar System in 0.13-um CMOS"; published in the proceedings of the Asia-Pacific Conference on Synthetic Aperture Radar; pp. 618-620; Seoul, Republic of Korea; Sep. 26-30, 2011. (Year: 2011).*

B. J. Rizzi et a., "A High-Power Millimeter-Wave Frequency Doubler Using a Planar Diode Array," IEEE Microwave and Guided Wave Letters, vol. 3, No. 6, Jun. 1993, 3 pages.

Y. Campos-Roca et al., "Coplanar pHEMT MMIC Frequency Multipliers for 76-GHz Automotive Radar," IEEE Microwave and Guided Wave Letters, vol. 9, No. 6, Jun. 1999, 3 pages.

W.L. Chan et al., "A 56-to-65GHz Injection-Locked Frequency Tripler with Quadrature Outputs in 90nm CMOS, " IEEE International Solid-State Circuits Conference, Feb. 6, 2008, 3 pages.

Z. Chen et al., "An 85-95.2 GHz Transformer-Based Injection-Locked Frequency Tripler in 65nm CMOS," IEEE, 2010, 4 pages.

H. P. Forstner et al., "Frequency Quadruplers for a 77GHz Subharmonically Pumped Automotive Radar Transceiver in SiGe," Proceedings of the 4th European Microwave Integrated Circuits Conference, Sep. 2009, Rome Italy, 4 pages.

T. Fujibayashi et al., "A 76-to 81-GHz Packaged Single-Chip Transceiver for Automotive Radar," IEEE, 2016, 4 pages.

I. Gresham et al., "A Compact Manufacturable 76-77-GHz Radar Module for Commercial ACC Applications, "IEEE Transactions on Microwave Theory and Techniques, vol. 49, No. 1, Jan. 2001, 15 pages.

V. Jain et al., "A BiCMOS Dual-Band Millimeter-Wave Frequency Synthesizer for Automotive Radars," IEEE Journal fo Solid-State Circuits, vol. 44, No. 8, Aug. 2009, 14 pages.

C. F. Jou et al., "Millimeter-Wave Diode-Grid Frequency Doubler," IEEE Transactions on Microwave Theory and Techniques, vol. 36, No. 11, Nov. 1988, 8 pages.

E. Kollberg et al., "Quantum-Barrier-Varactor Diodes for High-Efficiency Millimetre-Wave Multipliers," Electronics Letters, Dec. 7, 1989, vol. 25, No. 25, 3 pages.

S. Kudszus et al., "Subharmonically Injection Locked 94 GHz MMIC HEMT Oscillator Using Coplanar Technology," IEEE MTT-S Digest, 1998, 4 pages.

J. Lee et al., "A Fully-Integrated 77-GHz FMCW Radar Transceiver in 65-nm CMOS Technology," IEEE Journal of Solid-State Circuits, vol. 45, No. 12, Dec. 2010, 11 pages.

Y. Li et al., "A Fully Integrated 77GHz FMCW Radar System in 65nm CMOS," IEEE International Solid-State Circuits Conference, Session 11, 2010, 3 pages.

P. Mayr et al., "A 90GHz 65nm CMOS Injection-Locked Frequency Divider," IEEE International Solid-State Circuits Conference, Session 10, 2007, 3 pages.

O. Momeni et al., "A Broadband mm-Wave and Terahertz Traveling-Wave Frequency Multiplier on CMOS," IEEE Journal of Solid-State Circuits, vol. 46, No. 12, Dec. 2011, 11 pages.

A. Räisänen et al., "A Novel Split-Waveguide Mount Design for MM and SubMM Wave Frequency Multipliers and Harmonic Mixers," Jet Propulsion Laboratory, California Institute of Technology, 1993, 10 pages.

J. Song et al., "Q-band VCO and Injection-locked Buffer for 77-GHz Automotive Radar System in 0.13-µm CMOS," ISOCC 2010, 3 pages.

F. Wang et al., "Single-Antenna Doppler Radars Using Self and Mutual Injection Locking for Vital Sign Detection With Random Body Movement Cancellation," IEEE Transactions on Microwave Theory and Techniques, vol. 59, No. 12, Dec. 2011, 11 pages.

J. Wenger, "Automotive MM-Wave Radar: Status and Trends in System Design and Technology," The Institution of Electrical Engineers, 1998, 7 pages.

A. Wertfhof et al., "High Gain PHEMT Frequency Doubler for 76 GHz Automotive Radar," IEEE MTT-S Digest, 2001, 4 pages.

H. Wu et al., "A 16-to-18GHZ 0.18µm Epi-CMOS Divide-by-3 Injection-Locked Frequency Divider," IEEE International Solid-State Circuits Conference, Session 32, 2006, 3 pages.

* cited by examiner

APPARATUS AND METHOD FOR INTEGRATING SELF-TEST OSCILLATOR WITH INJECTION LOCKED BUFFER

TECHNICAL FIELD

Embodiments of the disclosure relate generally to an apparatus and method for wireless receivers. More specifically, the disclosure relates to an apparatus and method for integrating a self-test oscillator into an amplifier.

BACKGROUND

The use of multiple interconnected devices over a wide area, colloquially known as "internet of things" or "IOT," is a rapidly growing area of electronics engineering. Each interconnected device in an IOT arrangement can include one or more radio frequency (RF) components to provide signal transmission and reception with respect to other devices in the same network. The sheer number of interconnected devices in such arrangements has accompanied significant increases in the signal processing burden on electronic systems. One of the most important procedures for determining compliance with consumer and technical demands is the testing of RF components. Some tests must be conducted after a product is deployed, e.g., in cases where a product is being repaired, upgraded, etc. In such cases, the device itself must include circuitry for sending and measuring a test signal.

For signal processing applications, e.g., Automotive Radar and other millimeter wave applications require ability to have built in Self-test (BIST) to ensure functionality of circuits in products while in use. BIST and redundant circuits are used to ensure safety and performance of products. In conventional structures, distinct testing circuits are formed in a device, separately from other hardware, to generate electrical signals for testing the active components. These added circuits consume more power and occupy additional area. These attributes of BIST circuits have heretofore limited performance of a circuit, burdened manufacturing costs, and increased the total device power consumption.

SUMMARY

A first aspect of the present disclosure provides an apparatus including: an injection-locked buffer including: a pair of signal injection transistors each having a gate terminal coupled to a differential reference signal, and a pair of cross-coupled amplifier transistors configured to amplify a voltage of the differential reference signal to yield a voltage-amplified reference signal at a local oscillator (LO) port of a mixer; an electronic oscillator having an oscillation output node coupled to the LO port of the mixer in parallel with the injection-locked buffer, and configured to generate an oscillator output for transmission to the output node based on a back gate bias voltage applied to the electronic oscillator; and an access transistor having a gate coupled to a switching node, and a back gate terminal coupled to the back gate bias voltage, wherein the access transistor is configured to enable or disable current flow through the electronic oscillator in parallel with the injection-locked buffer.

A second aspect of the present disclosure provides a method for operating and testing a receiver in an electronic circuit, the method including: providing a structure including: an injection-locked buffer including: a pair of signal injection transistors each having a gate terminal, and a pair of cross-coupled amplifier transistors coupled between the pair of signal injection transistors and a local oscillator (LO) port of a mixer, an electronic oscillator having an oscillation output node coupled to the LO port of the mixer in parallel with the injection-locked buffer, and configured to generate an oscillator output for transmission to the output node based on a back gate bias voltage applied to the electronic oscillator, and an access transistor having a gate coupled to a switching node, and a back-gate terminal coupled to the back gate bias voltage, wherein the access transistor is configured to enable or disable current flow through the electronic oscillator in parallel with the injection-locked buffer; transmitting a differential reference signal to the gate terminal of the pair of signal injection transistors to amplify a voltage of the differential reference signal from an initial voltage to yield a voltage-amplified reference signal, wherein current flow through the access transistor is disabled during the transmitting; ending transmission of the differential reference signal; and enabling current flow through the electronic oscillator to bypass the injection-locked buffer after ending transmission of the differential reference signal, wherein the electronic oscillator generates a test signal to be output through the LO port of the mixer.

A third aspect of the present disclosure provides an apparatus including: an injection-locked buffer including: a pair of signal injection transistors each having a gate terminal coupled to a differential reference signal; a pair of cross-coupled amplifier transistors each including a gate terminal coupled to a drain of one of the pair of signal injection transistors, a source terminal coupled to a source terminal of one of the signal injection transistors, and a drain terminal coupled to a local oscillator (LO) port of a mixer, wherein the pair of cross-coupled amplifier transistors is configured to amplify a voltage of the differential reference signal to yield a voltage-amplified reference signal at the LO port of the mixer; an electronic oscillator having an oscillation output node coupled to the LO port of the mixer in parallel with the injection-locked buffer, and including a pair of cross-coupled transistors each having a back gate bias voltage, a source terminal coupled to an access node, and a drain terminal coupled to the LO port of the mixer and a gate terminal of the other cross-coupled transistor, wherein the cross-coupled transistors are configured to generate an oscillator output for transmission to the output node based on the back gate bias voltage; and an access transistor having a gate coupled to a switching node, and a back-gate terminal coupled to the back gate bias, wherein the access transistor is configured to enable or disable current flow through the electronic oscillator in parallel with the injection-locked buffer.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
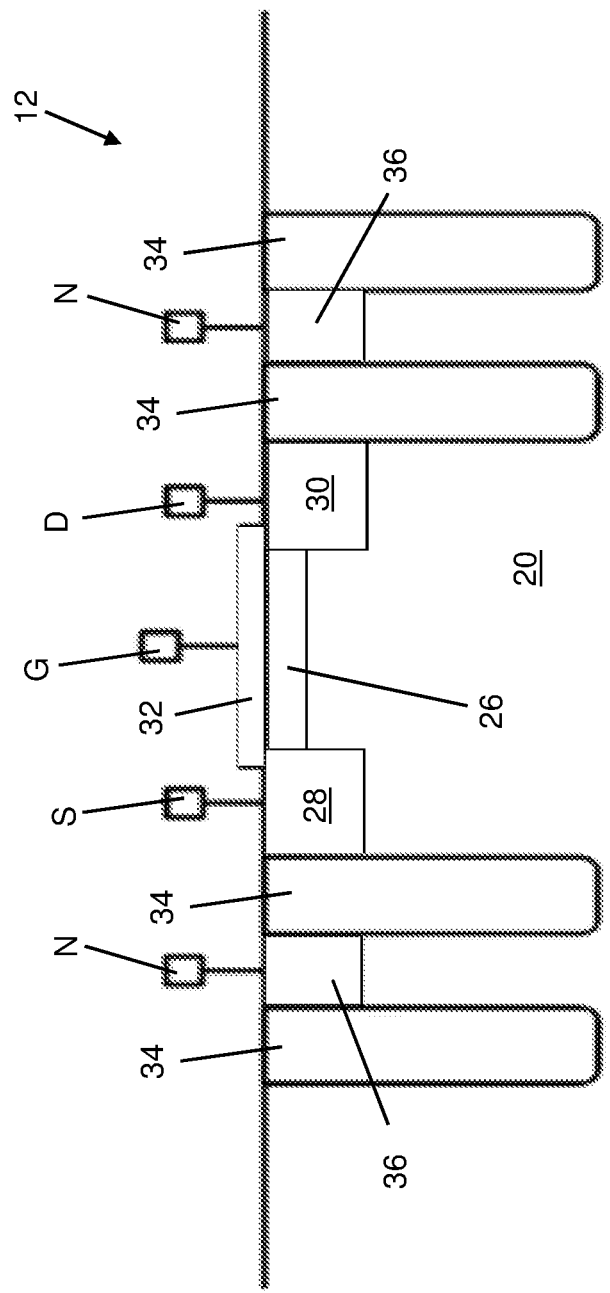
FIG. 1 shows a cross-sectional view of a conventional transistor structure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

The disclosure provides an apparatus for a wireless receiver, which integrates an injection-locked buffer and an oscillator for conducting a Built-In Self Test (BIST) into a single region of an integrated circuit (IC) chip. In one mode, an injection-locked buffer of the structure will receive an injected signal input, amplify the signal voltage, and output the voltage-amplified signal to a mixer. The voltage-amplified signal may act as a reference voltage signal for the processing of a radar input. When no incoming signals are detected, or when a user wishes to test the operation of the IC chip without using a reference signal, an access transistor enables current flow to an electronic oscillator. The electronic oscillator may be coupled to a local oscillator (LO) port of a mixer electrically in parallel with the injection-locked buffer, and integrated onto the same region of the IC chip. This allows for testing the receiver functionality without an incoming reference signal, which otherwise would be generated using a phase locked loop (PLL). The electronic oscillator may be formed of transistors with back gate terminals to reduce the threshold voltage of the electronic oscillator, thereby allowing test signals to be generated using a power supply of the injection-locked buffer. This integrating of an oscillator into the injection locked amplifier reduces power consumption of the amplifier as compared to conventional structures, which provide a separate, independent oscillator structure to generate test signals. The oscillator thus becomes part of the amplifier circuit, sharing a single power supply, and is not a separate circuit as required in conventional receiver circuits.

Referring to FIG. 1, a conventional transistor 12 is depicted as an example to emphasize structural and operational differences relative to transistors in various embodiments of the present disclosure. Conventional transistor 12 may be fabricated, e.g., by way of conventional fabrication techniques which may operate on a bulk silicon substrate. Conventional transistor 12 thus may be formed in a substrate 20 including, e.g., one or more semiconductor materials. Substrate 20 can include any currently known or later-developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, ×2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The entirety of substrate 20 or a portion thereof may be strained.

Source and drain nodes S, D of conventional transistor 12 may be coupled to regions of substrate 20 which include conductive dopants therein, e.g., a channel region 26 may be positioned between a source region 28 and a drain region 30. A gate region 32 formed on channel region 26 can be coupled to a gate node G to control a conductive channel within channel region 26. A group of trench isolations 34 may be formed from electrically insulating materials such that regions 26, 28, 30 are laterally separated from parts of other transistors. As shown, trench isolations 34 form an insulating barrier between terminals 36 and regions 26, 28, 30 and/or other elements. Further features of each element in conventional transistor 12 (e.g., function and material composition) are described in detail elsewhere herein relative to similar components in an FDSOI transistor 102 (FIG. 2) according to embodiments of the disclosure.

Figure 2:
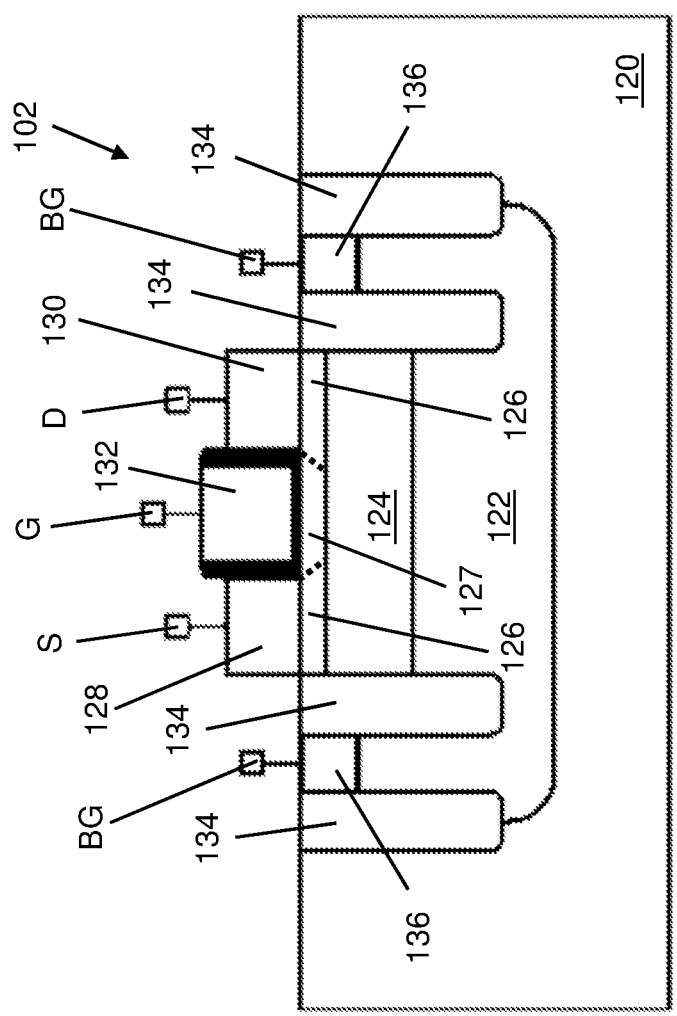
FIG. 2 shows a cross-sectional view of a fully depleted SOI (FDSOI) transistor structure with a back-gate region beneath a buried insulator layer according to embodiments of the disclosure.

Turning to FIG. 2, a cross-sectional view of a type of fully depleted semiconductor on insulator (FDSOI) transistor 102 which may be deployed, e.g., in structures and methods according to the disclosure, is shown. FDSOI transistor 102 can be formed with structural features for reducing the electrical resistance and capacitance across source and drain terminals S, D thereof. FDSOI transistor 102 and components thereof can be formed on and within a substrate 120. Substrate 120 can include any currently known or later-developed semiconductor material including, without limitation, one or more of the example semiconductor materials described elsewhere herein relative to substrate 20 (FIG. 1). A back-gate region 122, alternatively identified as an n-type or p-typed doped well region, of substrate 120 can be implanted or formed in-situ during deposition with one or more doping compounds to change the electrical properties thereof. Doping generally refers to a process by which foreign materials ("dopants") are added to a semiconductor structure to alter its electrical properties, e.g., resistivity and/or conductivity. Where a particular type of doping (e.g., p-type or n-type) is discussed herein, it is understood that an opposite doping type may be implemented in alternative embodiments. Implantation refers to a process in which ions are accelerated toward a solid surface to penetrate the solid up to a predetermined range based on the energy of the implanted ions. Thus, back-gate region 122 can include the same material composition as the remainder of substrate 120, but can additionally include dopant materials therein. A buried insulator layer 124, also known in the art as a "buried oxide" or "BOX" layer, can separate back-gate region 122 of substrate 120 from source/drain regions 126 and a channel region 127 of FDSOI transistor 102. Buried insulator layer 124 therefore may be composed of one or more oxide compounds, and/or any other currently known or later-developed electrically insulative substances. Buried insulator layer 124 being in a thin layer below the channel region 127 and extending below the source/drain regions 126 eliminates the need to add dopants to channel region 127. FDSOI transistor 102 therefore can be embodied as a "fully-depleted semiconductor on insulator" (FDSOI) structure, distinguishable from other structures (e.g., conventional transistor 12 (FIG. 1)) by including a dopant depleted channel region 127, buried insulator layer 124, back-gate nodes BG, etc., thereby allowing technical advantages such as an adjustable electric potential within back-gate region 122 of FDSOI transistor 102 as discussed elsewhere herein. Although FDSOI transistor 102 is shown and described as being formed with a particular arrangement of substrate 120, back-gate regions 122, and buried insulator layer 124, it is understood that FDSOI transistor 102 may alternatively be structured as a fin transistor, a nanosheet transistor, a vertical transistor, and/or one or more other currently-known or later-developed transistor structures for providing a back-gate terminal for adjusting the transistor's threshold voltage.

Source/drain regions 126 and channel region 127 may electrically couple a source terminal 128 of FDSOI transistor 102 to a drain terminal 130 of FDSOI transistor 102 when the transistor is in an on state. A gate stack 132 can be positioned over channel region 127, such that a voltage of gate node G controls the electrical conductivity between source and drain terminals 128, 130 through source/drain regions 126 and channel region 127. Gate stack 132 can have, e.g., one or more electrically conductive metals therein, in addition to a gate dielectric material (indicated with black shading between bottom of stack and channel region 127) for separating the conductive metal(s) of gate stack 132 from at least channel region 127. A group of trench isolations 134, in addition, can electrically and physically separate the various regions of FDSOI transistor 102 from parts of other transistors. Trench isolations 134 may be composed of any insulating material such as $SiO_2$ or a "high-k" dielectric having a high dielectric constant, which may be, for example, above 3.9. In some situations, trench isolations 134 may be composed of an oxide substance. Materials appropriate for the composition of trench isolations 134 may include, for example, silicon dioxide ($SiO_2$), hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), erbium oxide ($ErO_x$), and other currently known or later-developed materials having similar properties.

Back-gate region 122 can be electrically coupled to back-gate node BG through back-gate terminals 136 within substrate 120 to further influence the characteristics of transistor 102, e.g., the conductivity between source and drain terminals 128, 130 through source/drain regions 126 and channel region 127. Applying an electrical potential to back-gate terminals 136 at back-gate node BG changes the threshold voltage of the transistor. Conventional devices are incapable of adjusting threshold voltage to yield significant changes to the threshold voltage. FDSOI thus has a technology advantage over traditional devices. Among other effects, this difference in electrical potential between elements, including back-gate region 122 and source/drain regions 126, channel region 127, and of substrate 120, can affect the threshold voltage of FDSOI transistor 102, i.e., the minimum voltage for inducing electrical conductivity across source/drain and channel regions 126, 127 between first and second drain terminals 128, 130 as discussed herein. In particular, applying a forward back-gate biasing voltage to back-gate terminals 136 can lower the threshold voltage of FDSOI transistor 102, thereby reducing source drain resistance and increasing drain current, relative to the threshold voltage of FDSOI transistor 102 when a reverse (opposite) voltage bias is applied to back-gate terminals 136. This ability of FDSOI transistor 102, among other things, can allow a reduced width (saving silicon area) relative to conventional applications and transistor structures. In an example embodiment, a width of source/drain and channel regions 126, 127 (i.e., into and out of the plane of the page) can be between approximately 0.3 micrometers (μm) and approximately 2.4 μm. A length of source/drain and channel regions 126, 127 (i.e., left to right within the plane of the page) between first and second drain terminals 128, 130 can be, e.g., approximately twenty nanometers (nm). FDSOI technology transistors, e.g., FDSOI transistor 102, offer the ability to apply a voltage bias to back-gate region 122 to manipulate the threshold voltage $V_t$ (i.e., minimum voltage for channel activation) of FDSOI transistor 102. As described herein, applying calibration voltages to back-gate region 122 may allow an electronic oscillator for testing a circuit to be provided in the same cell as an injection-locked buffer for amplifying the voltage of a reference signal to a mixer. Back-gate region 122 can be set to a predetermined voltage bias to allow the transistors of an oscillator to produce testing signals in scenarios where no reference signal is transmitted through the corresponding injection-locked buffer. In circuit schematics shown in the accompanying FIGS. 4 and 5, any transistor which includes a back-gate terminal can be an embodiment of FDSOI transistor 102. Other transistors without back-gate terminals, by comparison, may alternatively take the form of any currently known or later developed transistor structure configured for use in a structure with FDSOI transistors 102.

Figure 3:
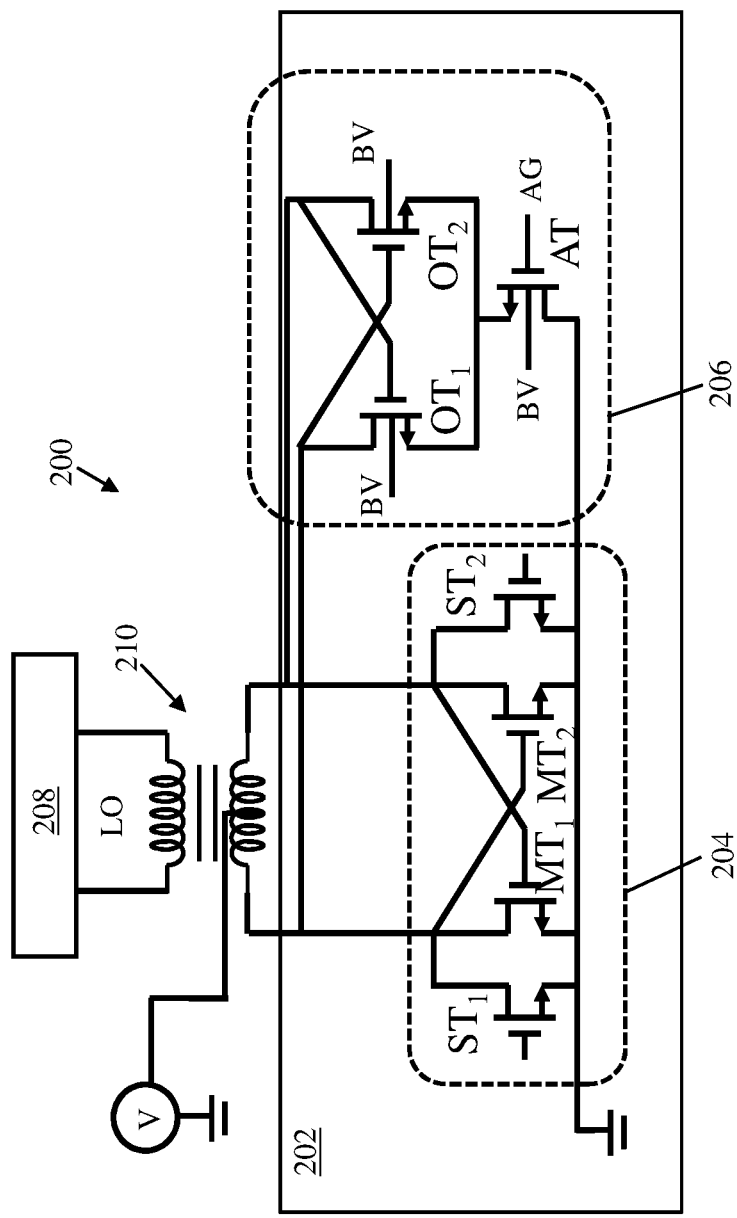
FIG. 3 shows a schematic view of an apparatus for a wireless receiver according to embodiments of the disclosure.

Referring to FIG. 3, an embodiment of an apparatus 200 for wireless receivers is shown according to embodiments of the disclosure. Apparatus 200 may be formed within a device cell 202 of an IC chip, e.g., an active area of a device structurally distinct from other areas of a device with other components formed therein. Apparatus 200 generally may be subdivided into two distinct subcomponents including an injection-locked buffer 204 and an electronic oscillator 206. As shown, injection-locked buffer 204 may be electrically coupled to a local oscillator (LO) port of a mixer 208 through a transformer 210. Electronic oscillator 206 may be electrically coupled to mixer 208 through transformer 210 in parallel with injection-locked buffer 204. An access transistor AT of electronic oscillator 206 may be electronically connected between injection-locked buffer 204 and electronic oscillator 206. Access transistor AT, as discussed in further detail herein, may selectively enable an on-board test of a wireless receiver by permitting current flow through electronic oscillator 206. When testing ends, access transistor AT may disable current flow through electronic oscillator 206 to prevent further testing.

Referring to FIG. 3, structure and functions of injection-locked buffer 204 as part of apparatus 200 are discussed in further detail. FIG. 3 provides a schematic view of apparatus 200 with parallel current flow through electronic oscillator 206. Injection-locked buffer 204 may include a pair of signal injection transistors $ST_1$, $ST_2$ for receiving a reference signal to be amplified in injection-locked buffer 204. In the art of wireless receivers, transmitters, etc., a reference signal may refer to an oscillated signal generated on transceiver hardware for defining the frequency, voltage, phase offset, and/or other properties of a signal to be processed on the hardware. In the case of a receiver, the reference signal is mixed with an incoming radar signal to allow the information in the signal to be processed, and thus received, on a device.

Injection transistors $ST_1$, $ST_2$ of injection-locked buffer 204 may be a differential pair configured to receive opposite-polarity portions of an incoming reference signal. Each injection transistor $ST_1$, $ST_2$ of the differential pair may be a conventional transistor as discussed relative to FIG. 1, or optionally may include an FDSOI transistor 102 as shown in FIG. 2. Each injection transistor $ST_1$, $ST_2$ may have a source terminal, a drain terminal, and a gate terminal as shown in the accompanying schematic and as discussed above. The gate terminal of each injection transistor $ST_1$, $ST_2$ may be configured to receive a portion of a differential reference signal to be voltage-amplified. A power supply V (e.g., a fixed and/or oscillating power supply) may be set to a predetermined voltage level to drive the amplification of incoming reference signals. Power supply V may be coupled to a center tap of an inductor (e.g., transformer 210 for mixer 208 as shown in FIG. 3), such that power supply V provides the sole power supply of injection-locked buffer 204. Power supply V also provides the sole power supply to electronic oscillator 206 as discussed elsewhere herein. The terms "voltage-amplification," "voltage-amplified," and variants thereof refer to increasing the voltage of an incoming signal without significantly affecting its frequency, phase offset, and/or other properties. In the case of a receiver, injection-locked buffer 204 may be configured to provide a very high swing output voltage with a signal sign of at least approximately 1.0 volts (V) peak to peak at 80 GHz, and/or other voltage levels suitable for a receiver for high-frequency applications (e.g., millimeter wave radar receivers) and/or defined in the operating specification for a device. High levels of voltage swing, e.g., at least 1.0 V peak to peak at 80 GHz, are generally required for acceptable performance of a millimeter wave radar receiver.

Injection-locked buffer 204 also includes a pair of cross-coupled amplifier transistors $MT_1$, $MT_2$, each of which include at least a source terminal, drain terminal, and a gate terminal for controlling current flow from source to drain. Cross-coupling refers to an electronic arrangement by which each transistor in a first pair is coupled at its gate to the source terminal of one transistor in a second pair. Each transistor in the second pair also includes a drain terminal electrically coupled to the source terminal of a transistor in the first pair. As shown, amplifier transistors $MT_1$, $MT_2$ are each cross-coupled at their gate to the source terminal of one injection transistor $ST_1$, $ST_2$. The cross-coupling of injection transistors $ST_1$, $ST_2$ to amplifier transistors $MT_1$, $MT_2$ will amplify the voltage of reference signals transmitted to injection transistors $ST_1$, $ST_2$ from an initial voltage to an amplification voltage. The level of amplification may be configured through the design of amplifier transistors $MT_1$, $MT_2$, the voltage level of power supply V, and/or other parameters of a receiver where apparatus 200 operates. As shown specifically in FIG. 4, injection-locked buffer 204 may amplify incoming reference signals for transmission to mixer 208 while access transistor AT is disabled. Electronic oscillator 206 thus may be included in apparatus 200 without affecting the function of injection-locked buffer 204 when access transistor AT is disabled.

Apparatus 200 may differ from conventional amplifiers by integrating additional components for conducting an electronic test of a receiver. Electronic oscillator 206 may include various components configured to generate a test signal for transmission to the receiver at the LO port of mixer 208, with lower power consumption than conventional solutions for integrating a local oscillator onto receiver hardware. Electronic oscillator may include, e.g., a pair of oscillation transistors $OT_1$, $OT_2$ coupled to mixer 208 and cross-coupled to each other at their gate and drain terminals. Electronic oscillator 206 is coupled to power supply V through a center tap at mixer 208. Thus, power supply V provides a single power supply to injection-locked buffer 204 and electronic oscillator 206. In contrast to other transistors of apparatus 200, each oscillation transistor $OT_1$, $OT_2$ includes a back-gate terminal configured to be coupled to a bias voltage BV. Bias voltage BV will adjust the threshold voltage of oscillation transistors $OT_1$, $OT_2$, i.e., the gate voltage required to enable or disable current flow from source to drain in each oscillation transistor $OT_1$, $OT_2$.

To provide a back gate terminal in oscillation transistors $OT_1$, $OT_2$, each oscillation transistor $OT_1$, $OT_2$, the device structure of FDSOI transistor 102 (FIG. 2) or equivalent transistor technology for permitting back-gate control over a transistor's threshold voltage. In any case, oscillation transistors $OT_1$, $OT_2$ will generate an oscillator output for transmission to mixer 210 based on bias voltage BV applied to each oscillation transistor $OT_1$, $OT_2$. The applying of bias voltage BV allows oscillation transistors $OT_1$, $OT_2$ to be coupled in parallel with injection-locked buffer 204 to integrate an oscillation component while keeping power consumption at the oscillator at an acceptable level. Specifically, applying bias voltage BV to reduce the threshold voltage of oscillation transistors $OT_1$, $OT_2$ will cause electronic oscillator 206 to consume at most approximately 105.0 milliwatts (mW) during an example operation. Additionally, injection-locked buffer 204 may permit testing with a passive mixer, as compared to requiring an active mixer with a separate power supply node coupled thereto.

Electronic oscillator 206 also includes an access transistor AT to provide a switch between ground and the source terminals of oscillation transistors $OT_1$, $OT_2$. Access transistor AT may also include FDSOI transistor 102 and/or other transistor architectures which include a back-gate terminal for reducing the threshold voltage. Access transistor AT thus may be coupled to bias voltage BV at its back-gate terminal, and a voltage applied to access gate terminal AG may enable or disable current flow from power supply V to mixer 208 through electronic oscillator 206. The enabling or disabling of current flow through access transistor AT may be responsive to various operating scenarios. For example, the receiver may not detect or otherwise receive incoming radar signals, e.g., due to an electrical failure which prevents signals from being emitted by a reference oscillator, e.g., a phase locked loop (PLL). Another scenario in automotive radar is disabling the reference signal during a down ramp to check receiver and signal processing unit. In such cases, a user may wish to test the signal processing functions of the receiver without relying on the PLL. A sample incoming radar signal can be generated on chip, e.g., using electronic oscillator 206 without other hardware, to test the receiver using the oscillator mode by enabling access transistor AT. Electronic oscillator 206 may be turned on while back gate voltage VT is applied to electronic oscillator 206 and access transistor AT. In this case, current will bypass injection-locked buffer 204 and instead pass through electronic oscillator 206. Electronic oscillator 206 will produce a test signal to be delivered to mixer 208, instead of a voltage-amplified reference signal. Apparatus 200 thus allows a user to alternatively generate reference signals for mixing with an incoming radar signal, or a test signal for evaluating the operation of signal processing components in the same receiver.

Figure 4:
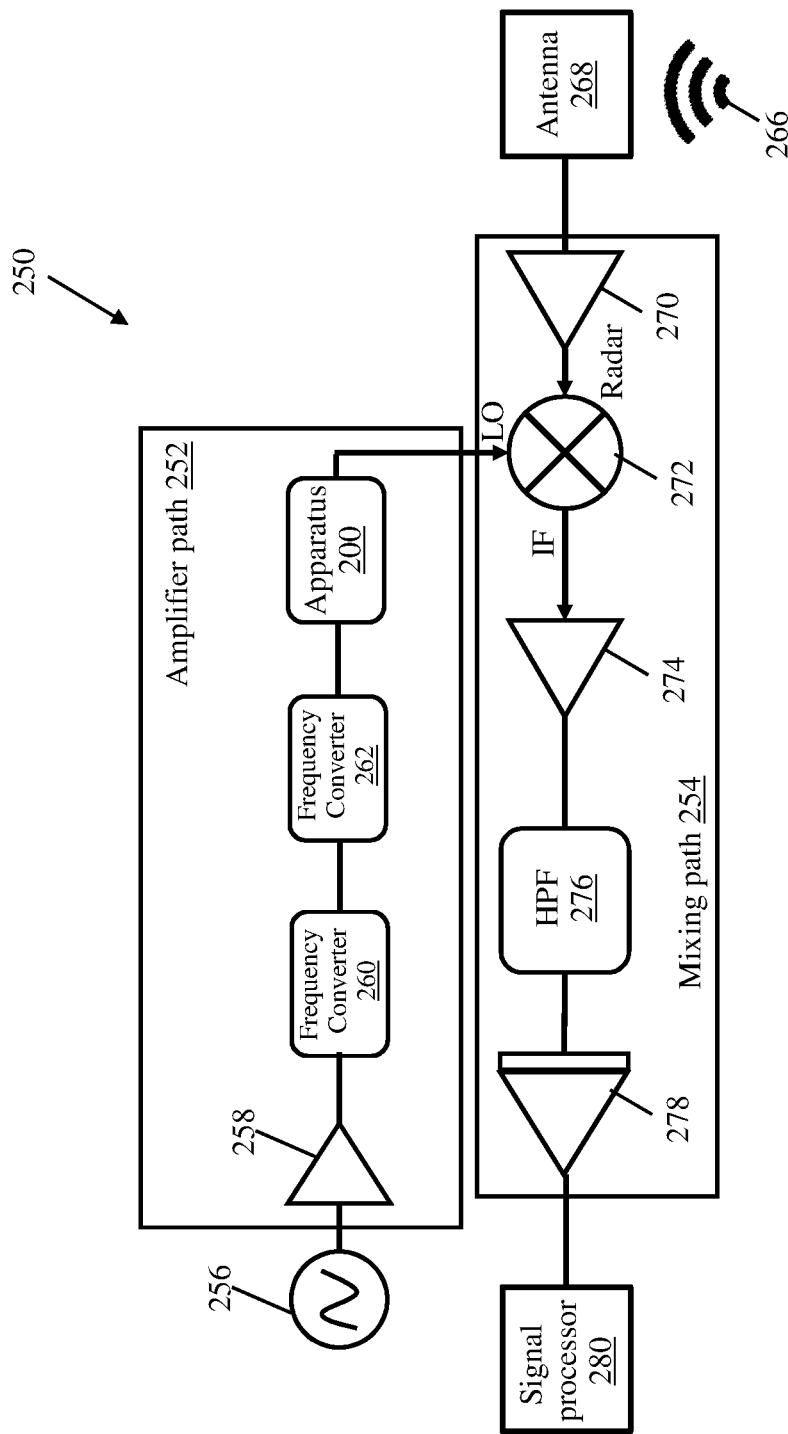
FIG. 4 shows a schematic view of a system for mixing a radar signal with a reference signal, including an apparatus according to embodiments of the disclosure.

Referring now to FIG. 4, a schematic block diagram of a receiver 250 is shown according to embodiments of the present disclosure. Receiver 250 may include an amplifier path 252 and a mixing path 254 each configured to modify incoming radar signals for processing at a receiver. Amplifier path 252 may include embodiments of apparatus 200 for amplifying the voltage swing of an incoming reference signal as discussed elsewhere herein. Mixing path 254 may be configured to mix voltage-amplified reference signals with incoming radar signals, or otherwise transmit test signals to signal processing components of receiver 250. A reference oscillator, also known as a "local oscillator" to denote its inclusion on the hardware of receiver 250, generates a reference signal to be mixed with a radar input. The initially-generated signal may have various parameters (e.g., frequency, amplitude, etc.) which do not conform to operating specifications.

Mixer path 252 may be configured to adjust these parameters to permit mixing when injection-locked buffer 204 (FIGS. 3, 4) of apparatus 200 is operating. Mixer path 252 may include, e.g., one or more buffers 258 from a reference oscillator 256 (e.g., a phase locked loop (PLL)) by a predetermined amount of time. Buffer 258 thus can compensate for any differences in phase offset in the reference signal and incoming radar signals. The amount of time delay can also be chosen based on future time delay as the reference signal travels through other components in amplifier path 252. A frequency converter 260 may increase the frequency of the reference signal from its initial value to a modified value. In some cases, the modified frequency may be a discrete multiple of the original frequency. In an example embodiment, reference oscillator 258 may generate signals with a frequency of approximately twenty gigahertz (GHz). Frequency converter 260 may include, e.g., a push push doubler (PPD) or other frequency multiplying component to multiply the reference signal frequency by two. The output from frequency converter 260 thus may be, e.g., forty GHz in the case of a PPD. An additional frequency converter 262 may further increase the signal frequency before it continues to apparatus 200. Additional frequency converter 262 may increase the frequency by a factor different from frequency converter 260, or may increase the signal frequency by the same multiple as frequency converter 260. In an example, additional frequency converter 262 may also include PPD to increase the incoming signal frequency from, e.g., approximately forty GHz to approximately eighty GHz. The frequency-modified reference signal may then proceed to apparatus 200, e.g., in the form of a differential input to injection transistors $ST_1$, $ST_2$ (FIGS. 3, 4). Frequency converter 262 thus may be coupled to each gate terminal of injection transistors $ST_1$, $ST_2$, thereby causing reference signals transmitted to apparatus 200 to have a predetermined mixing frequency (e.g., approximately eighty GHz in radar applications).

Mixer path 254 may be configured to receive incoming radar signals 266, mix the signals with voltage-amplified reference signals, and further modify the mixed signals (e.g., to reduce noise, further amplify voltage, etc.) before the incoming signals are processed. An antenna 268 may be configured to receive and electrically transmit incoming radar signals 266 to mixer path 254. Antenna 268 may include any currently known or later developed type of antenna for providing wireless transmission and/or receipt of communications, including radar signals. According to an example, antenna 268 may be printed or mounted directly or indirectly (e.g., with zero or more intermediate structural elements) onto a surface of a circuit board outside device cell 202. Antenna 268 may be sized to a relatively compact square surface area on a particular circuit board, e.g., approximately twenty mm by approximately 20 mm. According to other examples, antenna 268 may take the form of, e.g., one or more solenoid antennas and/or other types of antennas configured for use with receiver apparatus 200 and/or other types of transceiver hardware. Antenna 268 may be configured to receive incoming radar signals over a frequency band that is similar to the frequency of voltage-amplified signals output from apparatus 200. In one example, the frequency range of antenna 268 may be from approximately seventy-six GHz to approximately eighty-one GHz.

Mixer path 254 may include one or more components to amplify or otherwise process incoming radar signals before they are mixed with voltage-amplified reference signals. Mixer path 254 may include a low noise amplifier (LNA) 270 to amplify the power of radar signals detected via antenna 268. In electronics engineering, LNA 270 provides power amplification without increasing the signal-to-noise ratio of the incoming signals. LNA 270 thus may act as an amplifier of the incoming radar signal without significantly affecting the level of noise present in the detected signal(s). LNA 270 may electrically couple antenna 268 to a mixer 272 for combining the amplified radar signal with voltage-amplified reference signals output from injection-locked buffer 204 (FIGS. 3, 4) of apparatus 200.

Mixer 272 may operate as a multiplicative frequency mixer. That is, mixer 272 may output an electronic signal for processing with a frequency that is the product of the two incoming signal frequencies. Mixer 272 may be configured to convert incoming radar signals from LNA 270 to an intermediate frequency (IF) band using the voltage-amplified reference signal from apparatus 200. Mixer 272 may be a passive mixer, as may be required in the specification of transceiver devices such as receiver 250. A passive mixer generally refers to a frequency converter which does not consume power, and instead uses a set of internal switches. The switches may be electrically networked such that the circuit multiply the signal frequencies. Mixer 272 being in the form of a passive mixer will cause the signal output to be lower than that of the voltage-amplified reference signal and the amplified radar signal. Despite this reduction in power, mixer 272 will multiply the incoming signal from its initial frequency to a predetermined mixing frequency. The passive mixer relies on a high swing reference signal for proper functioning of the receiver at automotive radar frequencies of 80 GHz.

Remaining components of mixer path 254 may further prepare incoming signals for processing. As shown, the output of mixer 272 may be coupled to a transimpedance amplifier (TIA) 274. TIA 274 is generally configured to generate signals at a voltage level dependent on the current of the incoming signal. In general terms, TIA 274 may act as a current-to-voltage converter for setting the incoming signal to a specification voltage. The output of TIA 274 may be coupled to a High-pass filter (HPF) 276 configured to remove noise from the signal in mixer path 254. HPF 276 may be configured to remove portions of a signal below a predetermined threshold frequency, while transmitting portions of the signal above the predetermined threshold frequency. Mixer path 254 lastly may include an analog-to-digital converter (ADC) 278 for receiving sinusoidal waves output from HPF 276. ADC 278 may convert the sinusoidal waves to corresponding square waves capable of being interpreted in digital processing hardware. The digital signals output from ADC 278 may then proceed to a signal processor 280 for interpreting the incoming radar signals.

Referring to FIGS. 3 and 4 together, embodiments of receiver 250 may operate in a test mode when current flow through access transistor AT is enabled. In such cases, reference oscillator 256 may not transmit a reference signal and incoming radar signals may not be detected in antenna 268. In such cases, electronic oscillator 206 of apparatus 200 may generate a test signal configured to test the operation of the in radar applications. Electronic oscillator 206 may generate a test signal with a predetermined amplitude, frequency, and phase offset, e.g., by directly using the single power supply V. As noted elsewhere, electronic oscillator 206 may generate test signals within the same portion of a device where injection-locked buffer 204 is provided, and without the aid of external hardware. The test signal may proceed to mixer 272, which in the case of a passive mixer architecture will down-convert either an incoming radar signal or a test signal at the receiver input and output the test signal to TIA 274 and subsequent components of mixer path 254. The test signal may proceed directly to signal processor 280 to generate a test response. In this manner, apparatus 200 may be configured to electronically test receiver 254 and/or signal processor 280 using the same device cell 202 as injection-locked buffer 204. Among other advantages, embodiments of apparatus 200 may generate acceptable test signals at reduced power consumption as compared to conventional hardware. This advantage may be realized, e.g., by integrating FDSOI transistors 102 into electronic oscillator 206 of apparatus 200.

Figure 5:
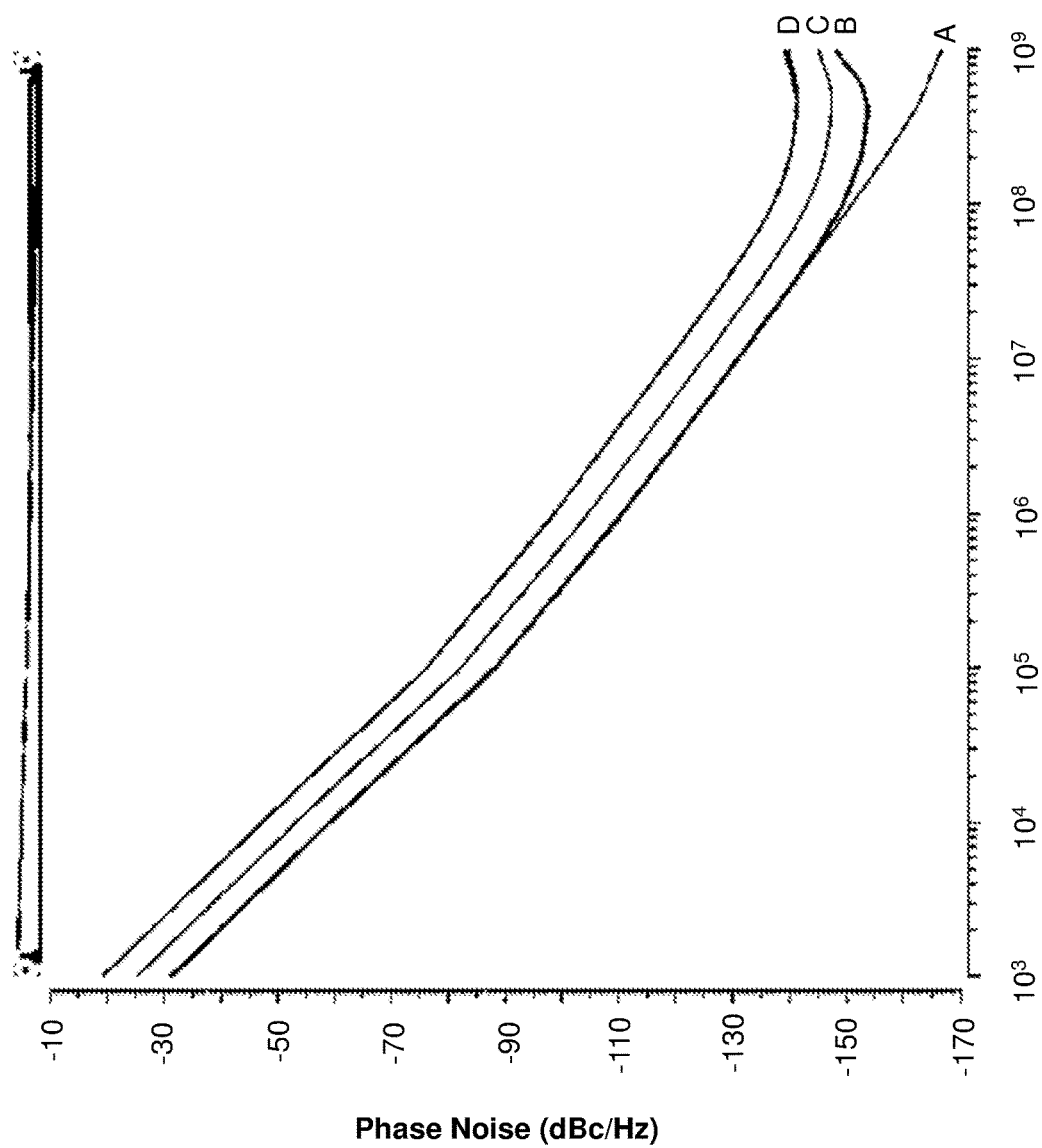
FIG. 5 shows a representative plot of phase noise versus frequency when operating an apparatus according to embodiments of the disclosure.
Figure 6:
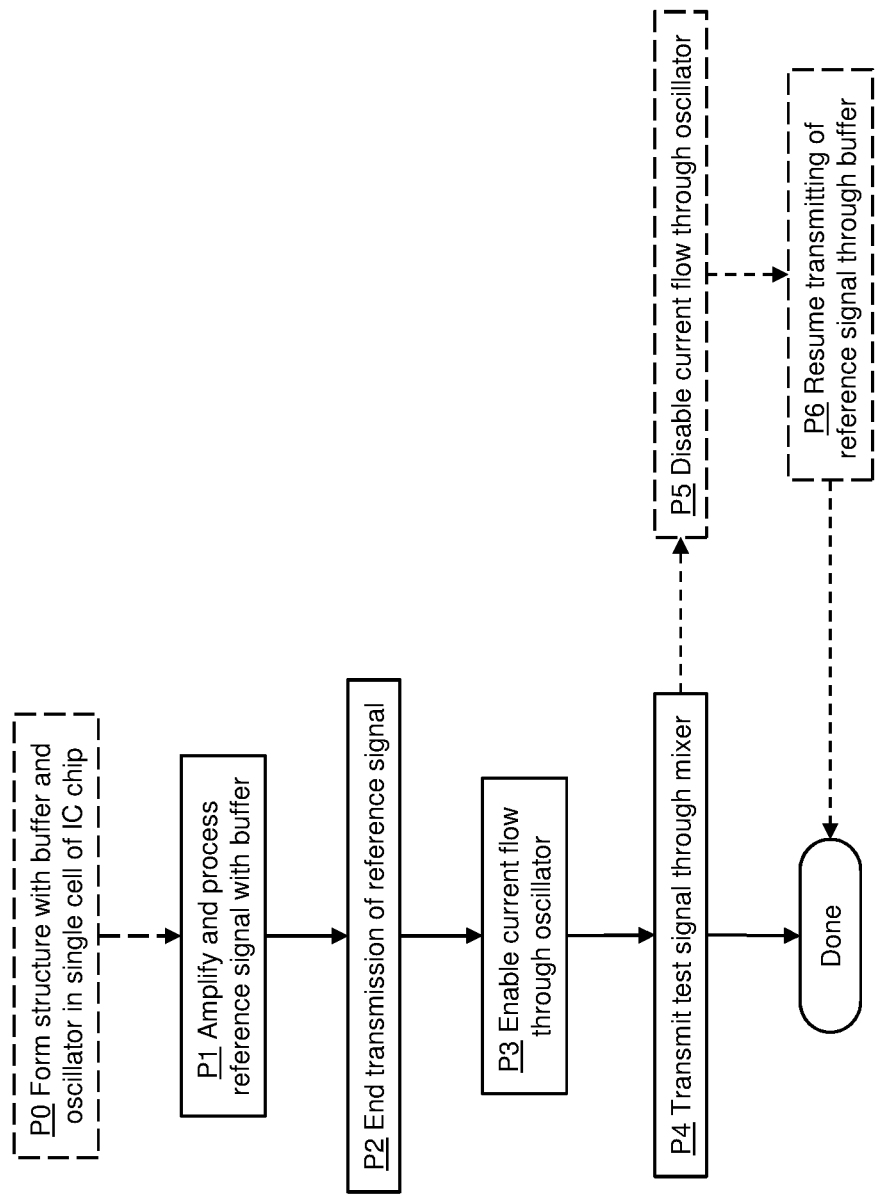
FIG. 6 provides an illustrative flow diagram of methods for operating and testing a receiver according to embodiments of the disclosure.

FIG. 5 provides an illustrative plot of generating and transmitting a reference signal to mixer 272 in embodiments of amplifier 250. Conventional design rules and constraints would teach away from incorporating oscillator hardware onto a voltage amplifier, e.g., because integrating components in this manner would load the voltage-amplified signal and increase power consumption and impede noise performance. However, embodiments of apparatus 200 avoid this problem by using FDSOI transistors 102 and/or similar transistor structures to reduce the threshold voltage of electronic oscillator 206. Reducing the threshold voltage for operating electronic oscillator 206 greatly reduces phase noise in the voltage-amplified signal as compared to past attempts to integrate amplifier and oscillator components. The plot in FIG. 6 illustrates phase noise (measured in decibels from carrier (dBc) over Hertz (Hz)) plotted against frequency (in Hz) over a range of frequencies. Trend line A illustrates the relationship of noise versus frequency for reference signals generated by reference oscillator 256 (FIG. 5) Trend line B illustrates the same function for signals exiting frequency converter 260 (FIG. 5). Trend line C illustrates the same parameters for signals exiting additional frequency converter 262 (FIG. 5) and entering apparatus 200 (FIGS. 3-5). Trend line D lastly shows reference signals entering mixer 272 (FIG. 5) from apparatus 200. As shown, the increase to phase noise is at most approximately 6.0 dBc/Hz across all frequencies, which is consistent with other device elements and commensurate with noise change due to frequency up-conversion injection-locked buffer. Moreover, the phase noise profile of reference signals to mixer 272 remains proportionate with the phase noise profile of signals from reference oscillator 256. Thus, embodiments of apparatus 200 successfully integrate amplifier and oscillator components into one portion of a device with a single power supply, and without creating additional noise contamination in a reference signal.

Turning now to FIGS. 3 and 6 embodiments of a method are shown according to the present disclosure. In addition to the structural features of apparatus 200, the disclosure provides an operational methodology for using apparatus 200 to operate and test receiver 250 as part of an electronic circuit. An initial process P0 (shown in phantom) may include forming an embodiment of apparatus 200 as part of receiver 250. The providing more specifically may include forming apparatus 200 in single device cell 202 with at least injection-locked buffer 204 and electronic oscillator included therein. The providing may also include modifying and/or otherwise obtaining receiver 250 with apparatus 200 integrated therein. Regardless of how receiver 250 with apparatus 200 is provided, process P1 of the method may include using reference oscillator 256 to generate a reference signal to be mixed with incoming radar signal(s) 266. In process P1, the transmitted reference signal passes through injection-locked buffer 204 of apparatus 200 to provide a voltage-amplified reference signal. The voltage-amplified reference signal is mixed with incoming radar signal(s) 266 in mixer 272 for signal processing operations as discussed elsewhere herein.

Continuing to process P2, a user may wish to electrically test receiver 250 and/or signal processor 280. Process P2 may include, e.g., ending transmission of the differential reference signal through apparatus 200. In some implementations, this may include disabling reference oscillator 256. Disabling reference oscillator 256 will also disable any incoming differential signals to injection transistors $ST_1$, $ST_2$ of injection-locked buffer 200. In this case, the method may include process P3 of enabling current flow through electronic oscillator 206 of apparatus 200. In some cases, reference oscillator 256 may be disabled due to a failure of other electrical hardware. The enabling in process P3 may include, e.g., applying back-gate bias voltage BV to access transistor AT and oscillator transistors $OT_1$, $OT_2$ to generate signals using power supply V of apparatus 200. Electronic oscillator 206 thus may generate a test signal, bypassing injection-locked buffer 202 for transmission to mixer 272. The test signal may proceed to signal processor 280 via mixer path 254 as discussed herein to generate a test response. The method may conclude ("Done").

In some cases, the method may include re-enabling the signal processing functions of receiver 250 after the test concludes. An alternative process flow shown in phantom may be implemented after transmitting the test signal through mixer 272 to signal processor 280 in process P4. Optional process P5 includes, e.g., disabling current flow through electronic oscillator 206 of apparatus 200 after generating the test signal with electronic oscillator 206. The disabling in process P5 may include, e.g., disconnecting the gate terminal of access transistor AT from a voltage and/or disconnecting the back-gate bias voltage BV from apparatus 200. At this point, current no longer flows through electronic oscillator 206 to generate a test voltage. The method may continue to process P6 of transmitting reference signals through injection-locked buffer 202 using reference oscillator 256. P6 also includes resuming the detection of incoming radar signals 266 at antenna 268. At this point, signal processing operations of receiver 250 have resumed and the method may conclude ("Done"). During subsequent operation, the method may repeat to conduct another test of receiver 250 and/or signal processor 280 using electronic oscillator 206. In all implementations, electronic oscillator 206 may be selectable between an enabled and disabled state by being integrated into the same portion of a device as injection-locked buffer 204, and being coupled to a single power supply V for powering injection-locked buffer 204 and electronic oscillator 206.

As used herein, the term "configured," "configured to" and/or "configured for" may refer to specific-purpose patterns of the component so described. For example, a system or device configured to perform a function may include a computer system or computing device programmed or otherwise modified to perform that specific function. In other cases, program code stored on a computer-readable medium (e.g., storage medium), may be configured to cause at least one computing device to perform functions when that program code is executed on that computing device. In these cases, the arrangement of the program code triggers specific functions in the computing device upon execution. In other examples, a device configured to interact with and/or act upon other components may be specifically shaped and/or designed to effectively interact with and/or act upon those components. In some such circumstances, the device is configured to interact with another component because at least a portion of its shape complements at least a portion of the shape of that other component. In some circumstances, at least a portion of the device is sized to interact with at least a portion of that other component. The physical relationship (e.g., complementary, size-coincident, etc.) between the device and the other component may aid in performing a function, for example, displacement of one or more of the device or other component, engagement of one or more of the device or other component, etc.

The descriptions us embodiment of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
    an injection-locked buffer including:
        a pair of signal injection transistors each having a gate terminal coupled to a signal line having a differential reference signal, and
        a pair of cross-coupled amplifier transistors configured to amplify a voltage of the differential reference signal to yield a voltage-amplified reference signal at a local oscillator (LO) input port of a mixer;
    an electronic oscillator having an oscillation output node coupled to the LO input port of the mixer in parallel with the injection-locked buffer, and configured to generate an oscillator output for transmission to the output node based on a back gate bias voltage applied to the electronic oscillator; and
    an access transistor having a gate coupled to a switching node, and a back gate terminal coupled to a line having the back gate bias voltage, wherein the access transistor is configured to enable or disable current flow through the electronic oscillator in parallel with the injection-locked buffer.

2. The apparatus of claim 1, wherein the access transistor comprises a fully depleted semiconductor on insulator (FDSOI) transistor, and wherein the back gate bias voltage is applied to the back gate terminal of the FDSOI transistor.

3. The apparatus of claim 2, wherein the electronic oscillator includes a pair of cross-coupled fully depleted semiconductor on insulator (FDSOI) transistors, and wherein the back gate bias voltage is applied to each back gate terminal of the pair of cross-coupled FDSOI transistors.

4. The apparatus of claim 1, wherein the LO input port of the mixer comprises a first input line to a receiver mixer, the receiver mixer having a second input line coupled to a radar input, and an output line coupled to a signal processing circuit, wherein the receiver mixer is configured to mix the voltage-amplified reference signal with the radar input.

5. The apparatus of claim 4, wherein the receiver mixer comprises a passive mixer.

6. The apparatus of claim 1, further comprising a power supply coupled to a center tap of the LO port of the mixer, wherein the power supply comprises a single power supply for the injection-locked buffer and the electronic oscillator.

7. The apparatus of claim 1, wherein the injection-locked buffer and the electronic oscillator are each included in a single device cell of an integrated circuit (IC) chip.

8. A method for operating and testing a receiver in an electronic circuit, the method comprising:
    providing a structure including:
        an injection-locked buffer including:
            a pair of signal injection transistors each having a gate terminal, and
            a pair of cross-coupled amplifier transistors coupled between the pair of signal injection transistors and a local oscillator (LO) port of a mixer,
        an electronic oscillator having an oscillation output node coupled to the LO port of the mixer in parallel with the injection-locked buffer, and configured to generate an oscillator output for transmission to the output node based on a back gate bias voltage applied to the electronic oscillator, and
        an access transistor having a gate coupled to a switching node, and a back-gate terminal coupled to the back gate bias voltage, wherein the access transistor is configured to enable or disable current flow through the electronic oscillator in parallel with the injection-locked buffer;
    transmitting a differential reference signal to the gate terminal of the pair of signal injection transistors to amplify a voltage of the differential reference signal from an initial voltage to yield a voltage-amplified reference signal, wherein current flow through the access transistor is disabled during the transmitting;
    ending transmission of the differential reference signal; and
    enabling current flow through the electronic oscillator to bypass the injection-locked buffer after ending transmission of the differential reference signal, wherein the electronic oscillator generates a test signal to be output through the LO port of the mixer.

9. The method of claim 8, further comprising:
    disabling current flow through the electronic oscillator after the electronic oscillator generates the test signal; and
    resuming the transmitting of the differential reference signal after disabling current flow through the electronic oscillator.

10. The method of claim 9, wherein disabling current flow through the electronic oscillator includes applying the back gate bias voltage to each back gate terminal of a pair of cross-coupled transistors of the electronic oscillator, and transmitting the test signal to each gate terminal of the pair of cross-coupled transistors of the electronic oscillator.

11. The method of claim 10, wherein disabling current flow through the electronic oscillator includes applying the back gate bias voltage to each back gate terminal of a pair of cross-coupled fully depleted semiconductor on insulator (FDSOI) transistors of the electronic oscillator, applying the back gate bias voltage to the access transistor, and transmitting the test signal to each gate terminal of the pair of cross-coupled FDSOI transistors of the electronic oscillator.

12. The method of claim 8, further comprising mixing the voltage-amplified reference signal or the test signal at the LO port of the mixer with a radar input signal to down-convert a mixed radar signal to a signal processing circuit.

13. The method of claim 8, wherein transmitting the differential reference signal to the gate terminal of the pair of signal injection transistors yields the voltage amplified reference signal with an amplitude of at least approximately one volt (V).

14. The method of claim 8, wherein the providing includes forming the injection-locked buffer and the electronic oscillator of the structure in a single device cell of an integrated circuit (IC) chip.

15. An apparatus comprising:
   an injection-locked buffer including:
      a pair of signal injection transistors each having a gate terminal coupled to a signal line having a differential reference signal;
      a pair of cross-coupled amplifier transistors each including a gate terminal coupled to a drain of one of the pair of signal injection transistors, a source terminal coupled to a source terminal of one of the signal injection transistors, and a drain terminal coupled to a local oscillator (LO) port of a mixer, wherein the pair of cross-coupled amplifier transistors is configured to amplify a voltage of the differential reference signal to yield a voltage-amplified reference signal at the LO port of the mixer;
   an electronic oscillator having an oscillation output node coupled to the LO port of the mixer in parallel with the injection-locked buffer, and including a pair of cross-coupled transistors each coupled to a back-gate line having a back gate bias voltage, a source terminal coupled to an access node, and a drain terminal coupled to the LO port of the mixer and a gate terminal of the other cross-coupled transistor, wherein the cross-coupled transistors are configured to generate an oscillator output for transmission to the output node based on the back gate bias voltage; and
   an access transistor having a gate coupled to a switching node, and a back-gate terminal coupled to a line having the back gate bias voltage, wherein the access transistor is configured to enable or disable current flow through the electronic oscillator in parallel with the injection-locked buffer.

16. The apparatus of claim 15, wherein the pair of cross-coupled transistors of the electronic oscillator and the access transistor each include a fully depleted semiconductor on insulator (FDSOI) transistor.

17. The apparatus of claim 16, wherein the access transistor comprises a fully depleted semiconductor on insulator (FDSOI) transistor, and wherein the back gate bias voltage is applied to the back gate terminal of the FDSOI transistor.

18. The apparatus of claim 15, wherein the LO port of the mixer comprises a first input line to a receiver mixer, the receiver mixer having a second input line coupled to a radar input, and an output line coupled to a signal processing circuit, wherein the receiver mixer is configured to mix the voltage-amplified reference signal with the radar input.

19. The apparatus of claim 15, wherein the injection-locked buffer and the electronic oscillator are each included in a single device cell of an integrated circuit (IC) chip.

20. The apparatus of claim 15, further comprising a mixer having a first mixer input at the LO port of the mixer, a second mixer input configured to receive radar signals, and a mixer output configured to transmit a mixed signal to a signal processing circuit of the IC chip.

* * * * *